(12) United States Patent
Ranish et al.

(10) Patent No.: US 8,901,518 B2
(45) Date of Patent: Dec. 2, 2014

(54) CHAMBERS WITH IMPROVED COOLING DEVICES

(71) Applicant: Applied Materials, Inc., Santa Clara, CA (US)

(72) Inventors: Joseph M. Ranish, San Jose, CA (US); Aaron Muir Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/787,960

(22) Filed: Mar. 7, 2013

(65) Prior Publication Data

US 2014/0027092 A1 Jan. 30, 2014

Related U.S. Application Data

(60) Provisional application No. 61/675,951, filed on Jul. 26, 2012.

(51) Int. Cl.
  *G21K 5/04* (2006.01)
  *F25B 29/00* (2006.01)

(52) U.S. Cl.
  CPC ..................................... *F25B 29/00* (2013.01)
  USPC .................. 250/492.1; 250/492.2; 250/493.1; 250/494.1; 250/504 R; 219/409; 219/410; 219/411; 392/407; 392/408; 392/418; 392/419

(58) Field of Classification Search
  USPC ................. 250/492.1, 492.2, 492.21, 492.22, 250/493.1, 494.1, 504 R; 219/409, 410, 219/411; 392/407, 408, 411, 418, 419
  See application file for complete search history.

(56) References Cited

U.S. PATENT DOCUMENTS

| 5,536,322 | A | 7/1996 | Wary et al. | |
|---|---|---|---|---|
| 6,679,318 | B2 | 1/2004 | Bakke | |
| 6,951,587 | B1 | 10/2005 | Narushima | |
| 8,222,574 | B2 * | 7/2012 | Sorabji et al. | 219/444.1 |
| 8,294,068 | B2 * | 10/2012 | Ranish et al. | 219/395 |
| 2001/0042594 | A1 | 11/2001 | Shamouilian et al. | |
| 2005/0194548 | A1 | 9/2005 | Quach et al. | |
| 2008/0012499 | A1 * | 1/2008 | Ragay et al. | 315/113 |
| 2010/0096109 | A1 | 4/2010 | Zhang et al. | |

FOREIGN PATENT DOCUMENTS

KR 20000059576 A 10/2000

OTHER PUBLICATIONS

International Search Report and Written Opinion, Patent Application: PCT/US2013/047970, dated Aug. 28, 2013.
J. Danneskiold; "Los Alamos-developed heat pipes ease space flight"; Los Alamos National Security, LLC; Apr. 26, 2000.
TTM Co., Ltd.; Cool TTM Website: coolttm.com/en/index.asp; Accessed Apr. 20, 2013.
MIT Home of the Future; "Heat Pipes History"; Website Address: architecture.mit.edu/house_n/web/resources/tutorials/House_N%20Tutorial%20Heat%20Pipes.htm; Accessed Apr. 20, 2012.
S.D. Garner; "Heat pipes for electronics cooling applications"; Electronics Cooling Magazine; Sep. 1996; Sep. 1, 1996.

* cited by examiner

*Primary Examiner* — Nicole Ippolito
(74) *Attorney, Agent, or Firm* — Patterson & Sheridan, LLP (57) ABSTRACT

Embodiments of the present invention provide a heating assembly using a heat exchange device to cool a plurality of heating element. The heating assembly includes a plurality of heating elements, a cooling element having one or more cooling channels for receiving cooling fluid therein, and a heat exchange device disposed between the plurality of heating elements and the cooling element. The heat exchange device comprises a hot interface disposed adjacent to and in thermal contact with the plurality of heating elements and a cold interface disposed adjacent to and in thermal contact with the cooling element.

20 Claims, 7 Drawing Sheets

CHAMBERS WITH IMPROVED COOLING DEVICES

CROSS-REFERENCE TO RELATED APPLICATIONS

This application claims benefit of U.S. Provisional Patent Application Ser. No. 61/675,951 filed Jul. 26, 2012, which is herein incorporated by reference.

BACKGROUND

1. Field

Embodiments of the present invention generally relate to apparatus and methods for processing semiconductor substrates. Particularly, embodiments of the present invention relate to apparatus and methods for cooling a heating assembly in a processing chamber.

2. Description of the Related Art

Some processes for fabricating semiconductor devices, for example rapid thermal processing, epitaxial deposition, chemical vapor deposition, physical vapor deposition, electron-beam curing, are performed at elevated temperatures. Usually substrates being processed are heated to a desired temperature in a processing chamber by one or more heat sources. For temperature control and safety reasons, the heat sources and chamber components may need to be cooled during processing. However, traditional cooling elements used in a semiconductor processing may be ineffective or non compatible for high temperature or high density heat sources.

Therefore, there is need for apparatus and methods for cooling a processing chamber.

SUMMARY OF THE INVENTION

Embodiments of the present invention generally provide apparatus and methods for cooling a processing chamber configured to process one or more substrates at elevated temperatures. Particularly, embodiments of the present invention relate to a heating assembly including a heat exchange device and a cooling element for temperature control of heating elements.

One embodiment of the present invention provides a heating assembly for heating a processing chamber. The heating assembly includes a plurality of heating elements, a cooling element having one or more cooling channels for receiving cooling fluid therein, and a heat exchange device disposed between the plurality of heating elements and the cooling element. The heat exchange device comprises a hot interface disposed adjacent to and in thermal contact with the plurality of heating elements and a cold interface disposed adjacent to and in thermal contact with the cooling element.

One embodiment of the present invention provides an apparatus for processing a substrate. The apparatus includes a chamber body forming a chamber enclosure, a substrate support disposed in the chamber enclosure, and a heating assembly disposed outside the chamber enclosure and configured to direct thermal energy towards the chamber enclosure. The heating assembly includes a plurality of heating elements, a cooling element having one or more cooling channels for receiving cooling fluid therein, and a heat exchange device disposed between the plurality of heating elements and the cooling element. The heat exchange device comprises a hot interface disposed adjacent to and in thermal contact with the plurality of heating elements and a cold interface disposed adjacent to and in thermal contact with the cooling element.

Another embodiment of the present invention provides a method for processing a substrate. The method includes directing radiant energy from a plurality of heating elements towards an enclose of a substrate processing chamber, and cooling the plurality of heating elements using a heat exchange device disposed between the plurality of heating elements and a cooling element, wherein the heat exchange device comprises a hot interface disposed adjacent to and in thermal contact with the plurality of heating elements and a cold interface disposed adjacent to and in thermal contact with the cooling element.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention relate to apparatus and methods for cooling a processing chamber. More particularly, embodiments of the present invention relate to a heating assembly having a heat exchange device for cooling heating elements. In one embodiment, the heat exchange device includes one or more heat pipes for rapid and uniform cooling. In one embodiment, the heat pipes may be integrated with the heating elements and a cooling element. Using heat pipes, rapid and uniform cooling may be provided to closely packed heating elements. The heating assembly according to embodiments of the present invention provides improved heat transfer, reduces thermal gradient and improves temperature uniformity, reduces thermal deformation and thermal stress.

Figure 1A:
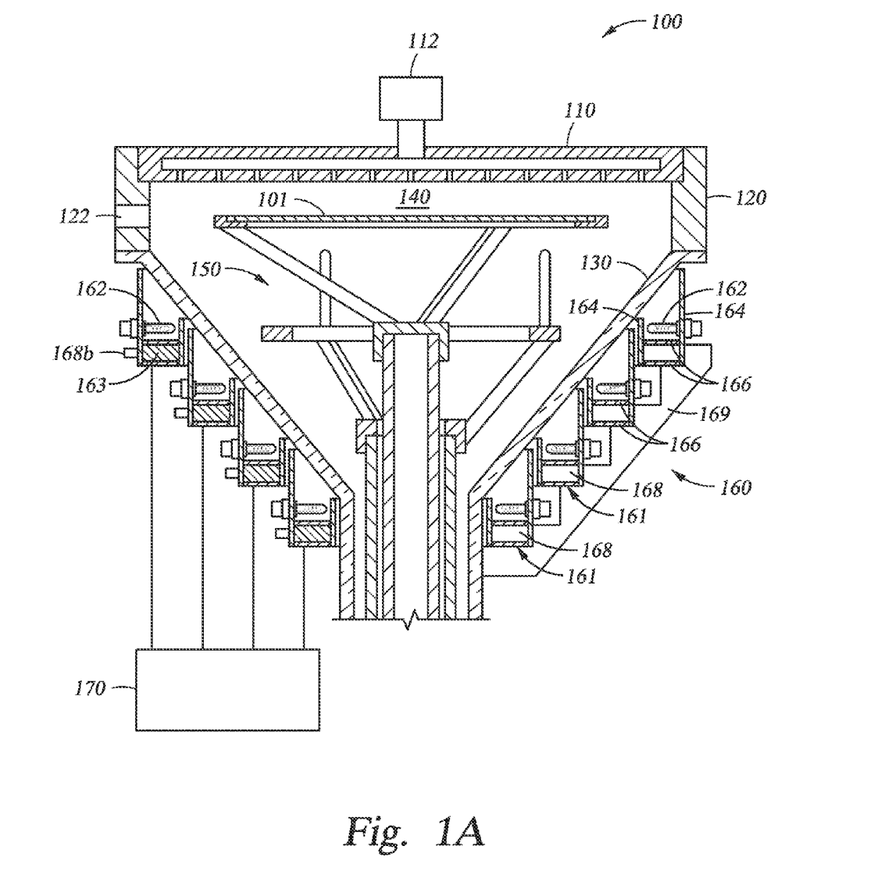
FIG. 1A is a schematic sectional view of a processing chamber according to one embodiment of the present invention.

FIG. 1A is a schematic sectional view of a processing chamber 100 according to one embodiment of the present invention. The processing chamber 100 may be used to perform various processes, such as epitaxial deposition. The processing chamber 100 comprises a chamber body 120, a showerhead assembly 110 disposed over the chamber body 120, and a lower dome 130 disposed under the chamber body 120. The showerhead assembly 110, the chamber body 120, and the lower dome 130 define a chamber enclosure 140 for processing one or more substrate therein. A slit valve door 122 may be formed through the chamber body 120 to allow the passages of a substrate 101.

A substrate support assembly 150 is movably disposed in the chamber enclosure 140 for supporting a substrate 101 during processing. The lower dome 130 is generally made from a material transparent or substantially transparent to thermal energy. In one embodiment, the lower dome 130 is made of quartz. Alternatively, the lower down 130 may be replaced by a quartz window.

The showerhead assembly 110 may be connected to a gas source 112 to distribute one or more processing gases to the chamber enclosure 140 for processing the substrate 101. The gas source 112 may include silicon sources for epitaxial deposition of silicon. The gas source 112 may comprise sources for precursors, carrier gas, and purge gas. In one embodiment, the gas source 112 may include sources of process gases for deposition of various metal nitride films, including GaN, aluminum nitride (AlN), indium nitride (InN), and compound films, such as AlGaN and InGaN. The gas source 112 may also comprise sources for non-reactive gases, such as helium (He), argon (Ar), or other gases such as hydrogen ($H_2$), nitrogen ($N_2$), and combinations thereof.

A heating assembly 160 is disposed below the lower dome 130 and is configured to provide thermal energy into the chamber enclosure 140 through the lower dome 130. The heating assembly 160 includes a plurality of heating elements 162, a cooling element 166 including one or more cooling channels 168, and one or more heat exchange devices 164 coupled between the cooling element and the plurality of heating elements 162. A cooling fluid source 170 may be coupled to the cooling element 166 to circulate a cooling fluid in the cooling channels 168.

The plurality of heating elements 162 may be ultra violet (UV) lamps, halogen lamps, laser diodes, resistive heaters, microwave powered heaters, light emitting diodes (LEDs), or any suitable heat sources.

In one embodiment, the heating assembly 160 may include a plurality of concentric heating units 161. The plurality of heating units 161 may be arranged at different elevations to form a suitable shape for heating the chamber enclosure 140. As shown in FIG. 1A, the plurality of heating units 161 may be mounted on a frame 169 to form a suitable shape, such as a dome surrounding the lower dome 130, to heat the chamber enclosure 140. The heat exchange devices 164 and the cooling element 166 in each of the plurality of heating units 161 form a circle and the heating elements 162 are evenly distributed around the circle. The number of heating elements 162 in each heating unit 161 may be different.

Figure 1B:
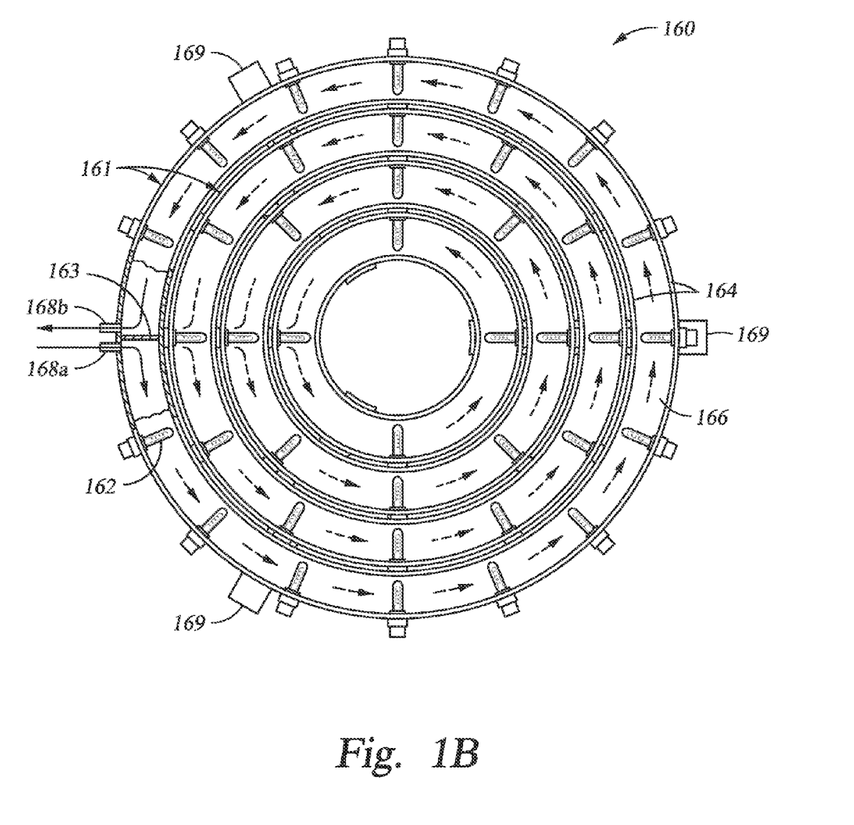
FIG. 1B is a schematic sectional perspective view of a heat source of the processing chamber of FIG. 1A.

FIG. 1B is a schematic top view of the heating assembly 160 with the lower dome 130 and the chamber body 120 removed. The heat exchange device 164 in adjacent heating units 161 may be overlapped. A central opening 165 may remain to provide passage for the substrate support assembly 150.

Figure 1C:
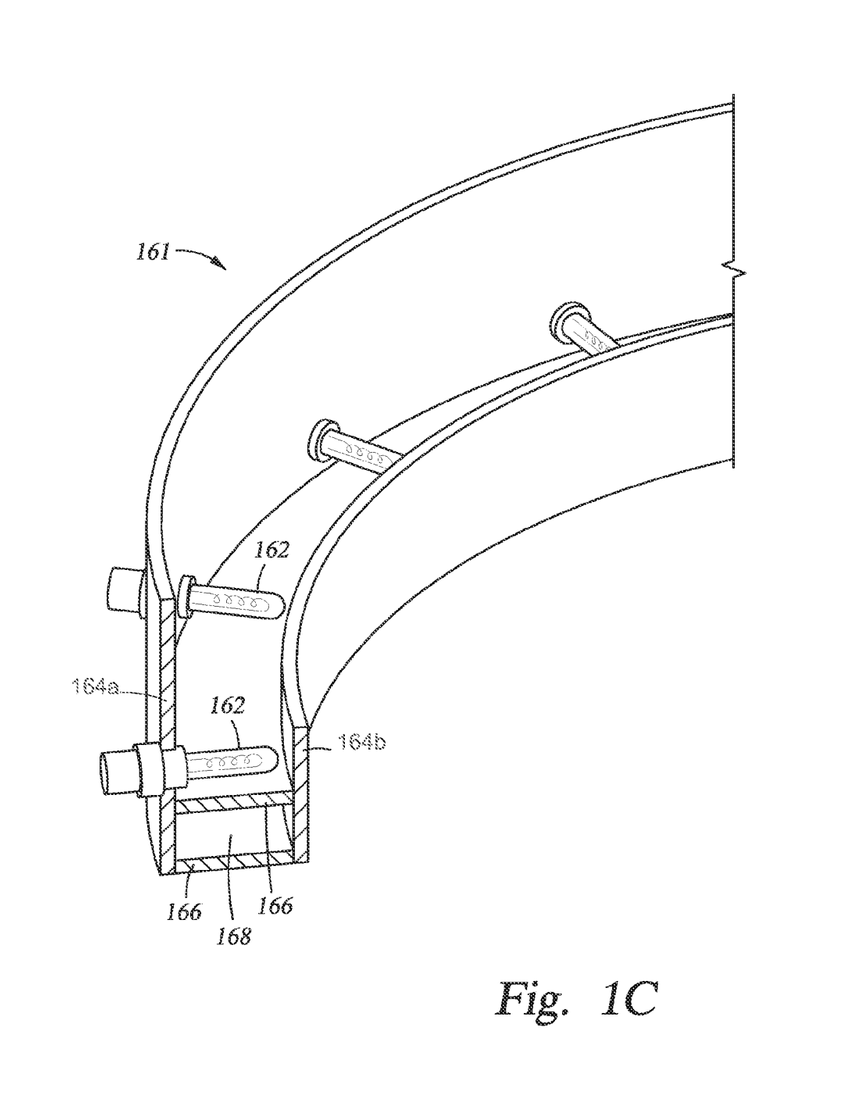
FIG. 1C is a schematic top view of the lamp assembly of FIG. 1B.

FIG. 1C is a schematic partial perspective sectional view of the heating unit 161 according to one embodiment of the present invention. The heating unit 161 includes an outer heat exchange device 164a and an inner heat exchange device 164b. The outer heat exchange device 164a and the inner heat exchange devices 164b may be concentrically arranged. As shown in the embodiment of FIG. 1C, the plurality of heating elements 162 may be integrated with the outer heat exchange device 164a. The cooling element 166 may include an upper ring 166a and a lower ring 166b. The upper ring 166a and the lower ring 166b may be substantially flat. As shown in FIG. 1C, the upper ring 166a and lower ring 166b are joined to lower ends of the inner heat exchange device 164b and the outer heat exchange device 164a to define the cooling channel 168. Alternatively, the cooling channel 168 may be formed without the inner heat exchange device 164b and the outer heat exchange device 164a.

Each cooling channel 168 may be a continuous circular channel having a divider 163 positioned between an inlet 168a and an outlet 168b to facilitate circulation of cooling fluid. Suitable cooling fluids include water, water-based ethylene glycol mixtures, a perfluoropolyether (e.g., Galden® fluid), oil-based thermal transfer fluids, liquid metals (such as gallium or gallium alloy) or similar fluids. The cooling fluid may be circulated through the cooling channels 168 to provide heat sink to the heat exchange devices 164.

The heat exchange device 164 is configured to provide uniform and rapid cooling to the plurality of heating elements 162. Because the heating elements 162 are arranged in relatively dense arrangement, there usually is not enough room for cooling channels between the heating elements 162 to provide efficient cooling for precise temperature control. The heat exchange device 164 may be in the form of thin sheet and can fit in the small space between the heating elements 162 to facilitate cooling. Additionally, the casing of the heat pipes in each heat exchange device 164 may also function as reflectors to prevent heat loss during heating.

Figure 2A:
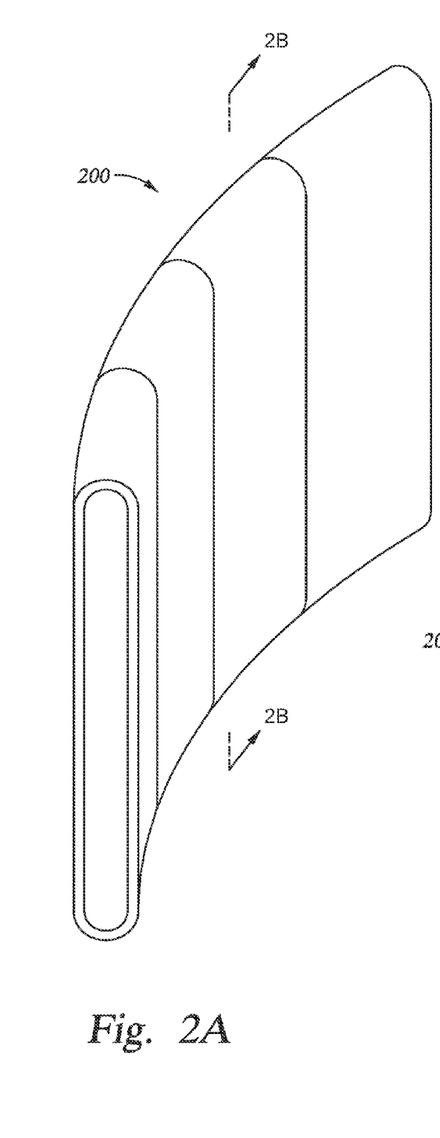
FIG. 2A is a schematic perspective view of a heat pipe according to one embodiment of the present invention.

According to embodiments of the present invention, the heat exchange device 164 may include one or more heat pipes. In one embodiment, the heat exchange device 164 may be one or more heat pipes in the form of thin sheets formed to be disposed around the plurality of heating elements 162. Each thin sheet may be composed of one or more laterally joined independent heat pipes. FIG. 2A is a schematic partial perspective view of a heat pipe 200 according to one embodiment of the present invention. The heat pipe 200 is in a thin sheet arched to form a portion of the heat exchange device 164 of FIG. 1A. As shown in FIG. 2A, the thin heat exchange device 164 is composed of a plurality of parallel and independently operating heat pipes.

Figure 2B:
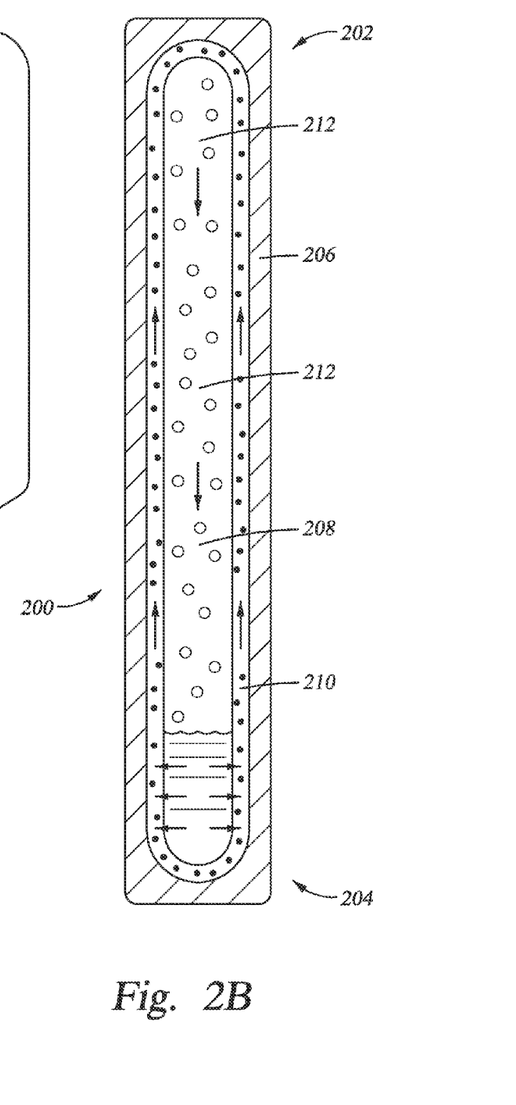
FIG. 2B is a schematic sectional view of the heat pipe of FIG. 2A.

FIG. 2B is a schematic sectional view of the heat pipe 200 of FIG. 2A. The heat pipe 200 includes a casing 206 enclosing a cavity 208. The casing may be formed from a material with high thermal conductivity, such as cooper or aluminum. The cavity 208 is vacuumed and filled with a fraction of a percent by volume of a working fluid 212. The working fluid 212 may be water, ethanol, acetone, sodium, or mercury. The working fluid 212 may be chosen according to the operating temperature of the heat pipe 200. Because the partial vacuum state within the cavity, a portion of the working fluid 212 in the cavity 208 is in liquid phase and the remaining portion the working fluid 212 is in gas phase.

The heat pipe 200 may have a hot interface 202 configured to be in thermal contact with a target to be cooled at a first end and a cold interface 204 configured to be in thermal contact with a heat sink an second end opposite to the hot interface 202. Optionally, a wick structure 210 may be lined inside the casing 206 and surrounding the cavity 208. The wick structure 210 is configured to exert a capillary pressure on a liquid surface of the working fluid 212 at the cold interface 204 and wick the working fluid 212 to the hot interface 202.

The heat pipe 200 is a heat exchange device that combines the principle of both thermal conductivity and phase transition to efficiently manage the transfer of heat between the hot interface 202 and the cold interface 204. At the hot interface 202 within a heat pipe, liquid of the working fluid 212 in contact with a thermally conductive casing 206 turns into vapor by absorbing heat from that heat source that is in thermal contact with the hot interface 202. The vapor condenses back into liquid at the cold interface 204, releasing the latent heat towards a heat sink in thermal contact with the cold interface. The liquid then returns to the hot interface 202 through either capillary action of the wick structure 210 or gravity action. The cycle repeats.

As discussed above, the heat exchange device 164 in the heating assembly 160 including one or more heat pipes with hot interfaces in thermal contact with the plurality of the heating elements 162 and cold interfaces in thermal contact with the cooling element 166. As a result, the plurality of heating elements 162 may be cooled by the cooling fluid in the cooling channels 168. The heat pipes in the heat exchange devices 164 to provide rapid and uniform cooling to the plurality of heating elements 162 so that the temperature of the chamber enclosure 140 may be controlled rapidly, uniformly and precisely.

A heating assembly including heat pipes may have different designs adapted to different processing chambers. Different type of heating elements may be used. Heating elements may be arranged in various arrangements. Heat pipes may be shaped and arranged to cool heating elements in various arrangements.

Figure 3A:
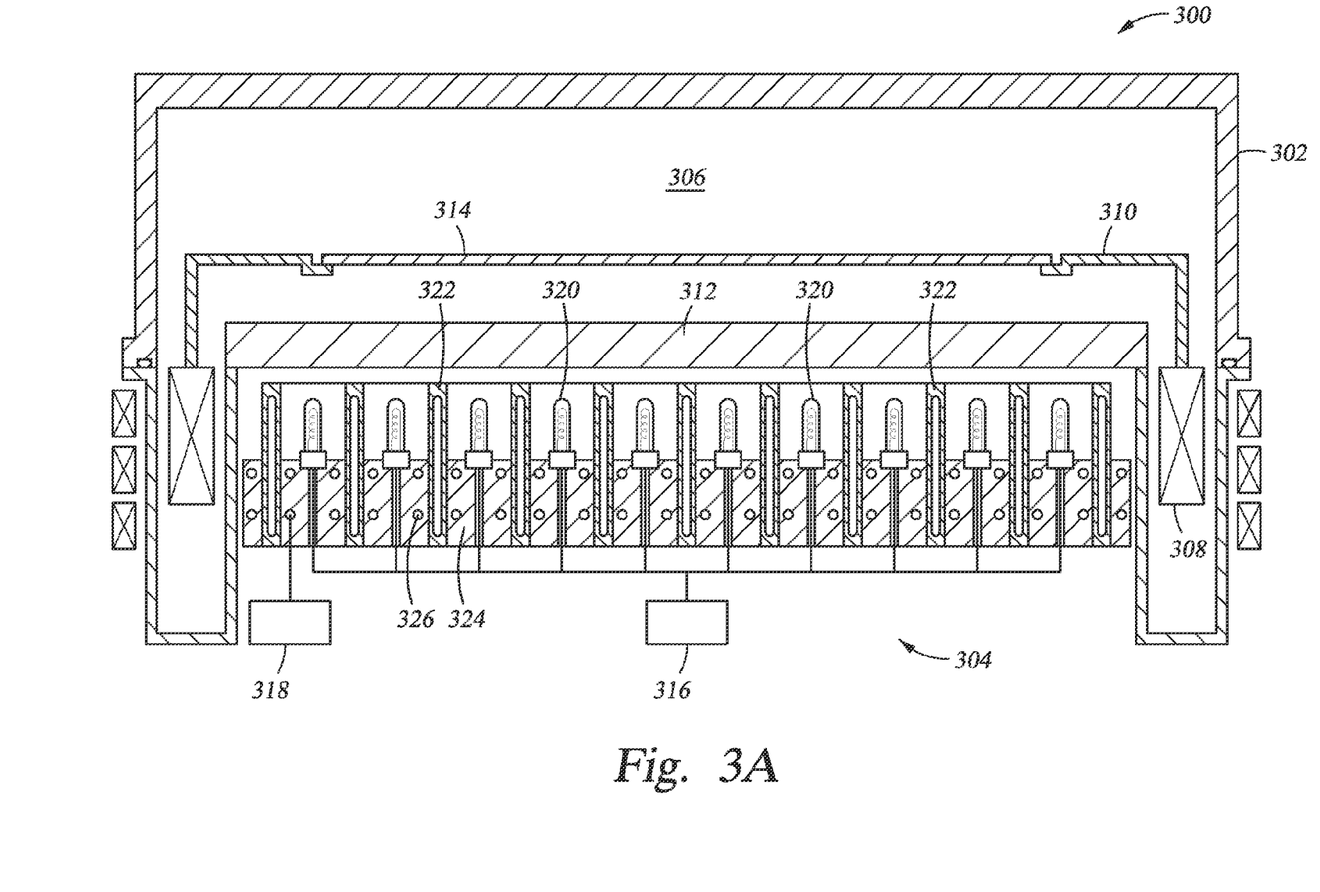
FIG. 3A is a schematic sectional view of a rapid thermal processing chamber according to one embodiment of the present invention.

FIG. 3A is a schematic sectional view of a rapid thermal processing chamber 300 according to one embodiment of the present invention. The thermal processing chamber 300 includes a heating assembly 304 disposed under a chamber body 302. The chamber body 302 defines a processing volume 306 for processing a substrate 314 therein. A tubular riser 308 may be disposed in the processing volume 306 for supporting and rotating the substrate 314. The substrate 314 may be in contact at a periphery edge and supported by an edge ring 310 disposed on the tubular riser 308. The chamber body 302 may include a quartz window 312. The heating assembly 304 is disposed outside the quartz window 312 to provide thermal energy to the processing volume 306.

The heating assembly 304 includes a plurality of heating elements 320 mounted on a frame 324. The plurality of heating elements 320 may be closely arranged to generate thermal energy intense enough for rapid thermal processing. The plurality of heating elements 320 may be connected to a power source 316. The plurality of heating elements 320 may be grouped into two or more independently adjustable heating zones to achieve desired heating effects. The plurality of heating elements 162 may be ultra violet (UV) lamps, halogen lamps, laser diodes, resistive heaters, microwave powered heaters, light emitting diodes (LEDs), or any suitable heat sources.

The frame 324 has cooling channels 326. The cooling channels 326 may be coupled to a cooling fluid source 318 to provide indirect temperature control to the plurality of heating elements 320. The cooling fluid source 318 may provide a suitable cooling fluid, such water, water-based ethylene glycol mixtures, a perfluoropolyether (e.g., Galden® fluid), oil-based thermal transfer fluids, liquid metals (such as gallium or gallium alloy) or similar fluids.

A plurality of heat exchange devices 322 are disposed between the plurality of heating elements 320 and the cooling channels 326 in the frame 324 to provide heat exchange between the cooling fluid in the cooling channels 326 and the plurality of heating elements 320.

Each heat exchange device 322 may include one or more heat pipes, such as the heat pipes 200 of FIGS. 2A-2B. The one or more heat pipes in each heat exchange device 322 are arranged to have a hot interface positioned adjacent to one or more heating elements 320 and a cold interface positioned within the frame 324 adjacent one or more cooling channels 326. The heat exchange devices 322 allow the heating elements 320 to be cooled rapidly by the cooling fluid not indirect contact with the heating elements 320.

Figure 3B:
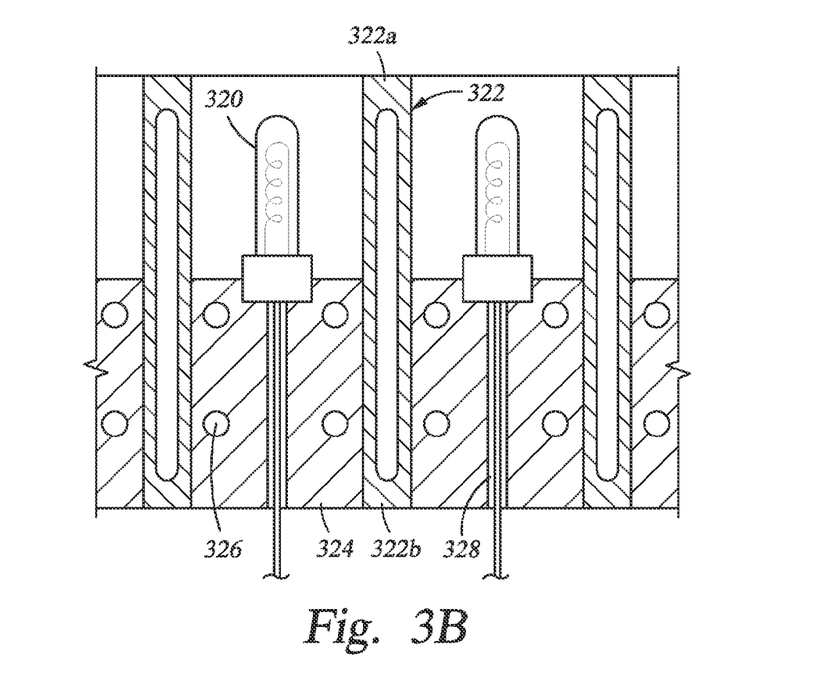
FIG. 3B is a schematic top view of a heat source in the rapid thermal processing chamber of FIG. 3A.

FIG. 3B is a schematic partial top view of the heating assembly 304 in the rapid thermal processing chamber 300 of FIG. 3A. The plurality of heating elements 320 are closely arranged within one plane. The heat exchange devices 322 form vertical walls around the heat generation portion of each heating element 320 for cooling. FIG. 3B shows the plurality of heating elements arranged in a hexagonal pattern. The heat exchange devices 322 form hexagonal cells surrounding the plurality of heating elements 320 for heat exchange.

Figure 3C:
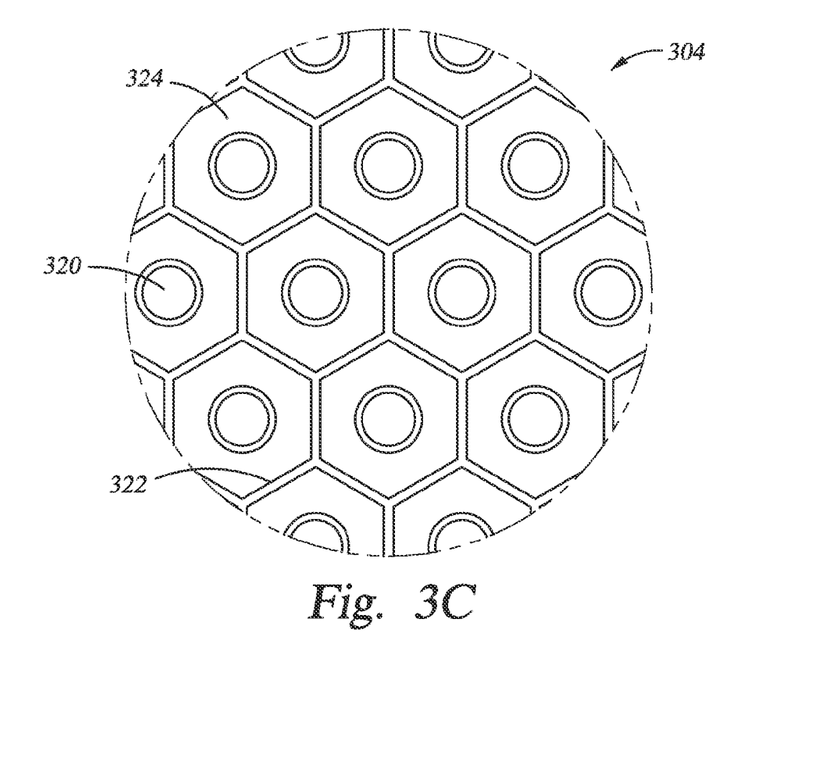
FIG. 3C is a schematic enlarged partial sectional view of the heat source of FIG. 3B.

FIG. 3C is a schematic enlarged partial sectional view of the heating assembly 304 of FIG. 3A. Each of the plurality of heating elements 320 is mounted on the frame 324 through an opening 328. The opening 328 may be a through hole to allow wiring to pass there through. The heat exchange device 322 may have a cold interface 322b disposed within the frame 324 adjacent the cooling channels 326 and a hot interface 322a next to the heating elements 320.

By using heat exchange devices 322 formed from heat pipes, the closely packed heating elements 320 in the heating assembly 304 may be uniformly and rapidly cooled, thus, enabling precise temperature control of the rapid thermal processing chamber 300.

Figure 4A:
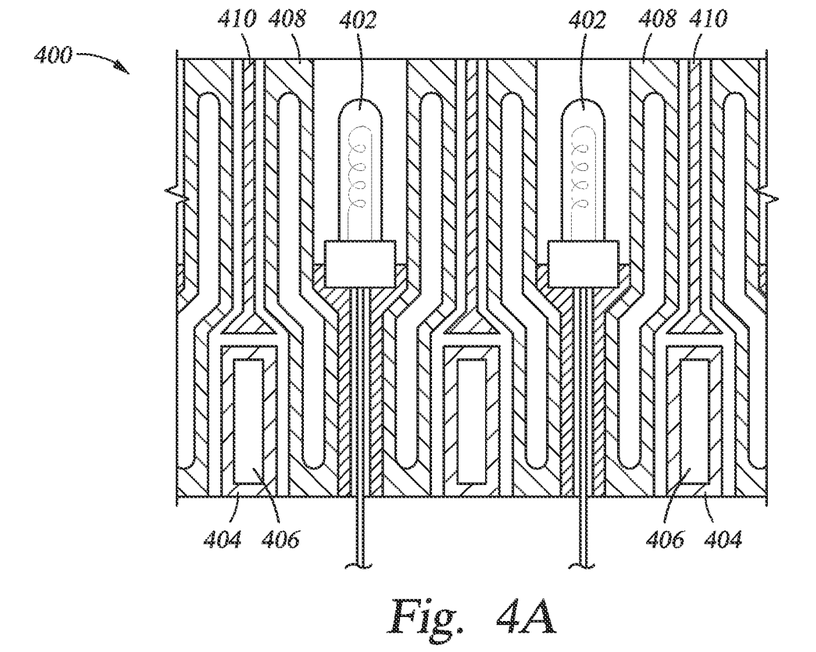
FIG. 4A is a schematic enlarged partial sectional view of a heat source according to another embodiment of the present invention.

FIG. 4A is a schematic enlarged partial sectional view of a heating assembly 400 according to another embodiment of the present invention. The heating assembly 400 is similar to the heating assembly 304 except that the heating assembly 400 includes a heat exchange device 408 having a bent profile. The heating assembly 400 includes a plurality of heating element 402, and a cooling base 404 having cooling channels 406, and a plurality of heat exchange devices 408 disposed between the plurality of heating elements 402 and the cooling base 404. The plurality of heating elements 402 may be closely arranged. The heat exchange device 408 may be formed by one or more heat pipes. The heat exchange device 408 may be bent to accommodate the close arrangement of the heating elements 402 and to allow larger space for the cooling channels 406. Optionally, a supporting frame 410 may be used between neighboring heat exchange devices 408.

Figure 4B:
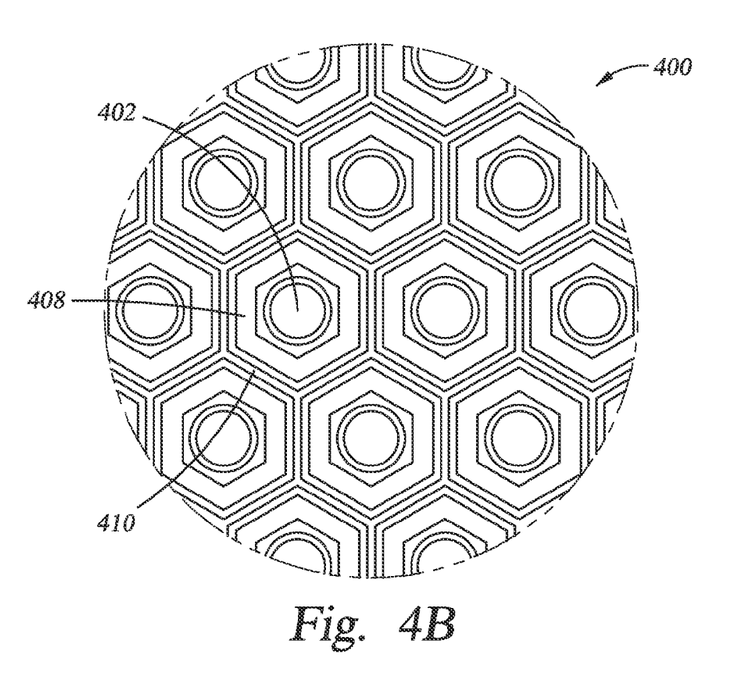
FIG. 4B is a schematic partial exploded view of the heat source of FIG. 4A.

FIG. 4B is a schematic partial exploded view of the heating assembly 400 of FIG. 4A. The plurality of heating elements 402 are arranged in a hexagonal pattern. Alternately, other suitable patterns may be used.

Even though, the heating assemblies are described with epitaxial deposition chambers, rapid thermal processing chambers, heating assemblies according to embodiment of the present invention may be used with any suitable processing chamber where cooling of densely packed heating elements are needed.

While the foregoing is directed to embodiments of the present invention, other and further embodiments of the invention may be devised without departing from the basic scope thereof, and the scope thereof is determined by the claims that follow.

What is claimed is:

1. A heating assembly for heating a processing chamber, comprising:
   a plurality of heating elements;
   a cooling element having one or more cooling channels for receiving cooling fluid therein; and
   a heat exchange device disposed between the plurality of heating elements and the cooling element, wherein the heat exchange device comprises a hot interface disposed adjacent to and in thermal contact with the plurality of heating elements and a cold interface disposed adjacent to and in thermal contact with the cooling element, and the heat exchange device comprises one or more heat pipes, each heat pipe comprising:
      a thermal conductive shell forming a sealed chamber; and
      a working fluid disposed in the sealed chamber, wherein a first portion of the working fluid is in liquid phase and a second portion of the working liquid is in gas phase.

2. The heating assembly of claim 1, wherein the one or more heat pipes is integrated with the cooling element to form the one or more cooling channels for receiving the cooling fluid.

3. The heating assembly of claim 1, wherein the plurality of heating elements are closely arranged in a plane, and the one or more heat pipes are laterally joined in the form of thin sheet surrounding each of the plurality of heating elements.

4. The heating assembly of claim 3, wherein the plurality of heating elements are grouped to form a plurality of heating zones.

5. The heating assembly of claim 3, wherein the plurality of heating elements are arranged in a hexagon pattern.

6. The heating assembly of claim 1, wherein the cooling element forms one or more circles and the plurality of heating elements are evenly distributed along the one or more circles.

7. The heating assembly of claim 1, wherein the one or more heat pipes are joined latterly to form of a thin sheet.

8. The heating assembly of claim 1, wherein each of the one or more heat pipes further comprises a wick structure lined inside the thermal conductive shell.

9. The heating assembly of claim 1, wherein the heat exchange device comprises a plurality of parallel and independently operating heat pipes.

10. An apparatus for processing a substrate, comprising:
    a chamber body forming a chamber enclosure;
    a substrate support disposed in the chamber enclosure; and
    a heating assembly disposed outside the chamber enclosure and configured to direct thermal energy towards the chamber enclosure, wherein the heating assembly comprises:
       a plurality of heating elements;
       a cooling element having one or more cooling channels for receiving cooling fluid therein; and
       a heat exchange device disposed between the plurality of heating elements and the cooling element, wherein the heat exchange device comprises a hot interface disposed adjacent to and in thermal contact with the plurality of heating elements and a cold interface disposed adjacent to and in thermal contact with the cooling element, and the heat exchange device comprises one or more heat pipes, each of the one or more heat pipes comprising:
          a thermal conductive shell forming a sealed chamber; and
          a working fluid disposed in the sealed chamber, wherein a first portion of the working fluid is in liquid phase and a second portion of the working liquid is in gas phase.

11. The apparatus of claim 10, wherein the chamber body comprises a quartz window, and the heating assembly is disposed outside the quartz window.

12. The apparatus of claim 11, further comprising a gas distribution showerhead distributed over the substrate support, and the quartz window is disposed below the substrate support.

13. The apparatus of claim 12, wherein the quartz window is shaped like a cone, and the cooling element of the heating assembly forms concentric circles and the plurality of heating elements are evenly distributed along the concentric circles.

14. The apparatus of claim 11, wherein the plurality of heating elements are closely arranged in a plane, and the one or more heat pipes are laterally joined to form a thin sheet surrounding each of the plurality of heating elements.

15. The apparatus of claim 14, wherein the plurality of heating elements are grouped in multiple heating zones.

16. The apparatus of claim 11, wherein the apparatus is one of a rapid thermal processing chamber, epitaxial deposition chamber, chemical vapor deposition chamber, physical vapor deposition chamber, or electron beam curing chamber.

17. The apparatus of claim 11, wherein the plurality of heat elements are one of ultra violet (UV) lamps, halogen lamps, laser diodes, resistive heaters, microwave powered heaters, or light emitting diodes (LEDs).

18. A method for processing a substrate, comprising:
    directing radiant energy from a plurality of heating elements towards an enclose of a substrate processing chamber; and
    cooling the plurality of heating elements using a heat exchange device disposed between the plurality of heating elements and a cooling element, wherein the heat exchange device comprises a hot interface disposed adjacent to and in thermal contact with the plurality of heating elements and a cold interface disposed adjacent to and in thermal contact with the cooling element, and the heat exchange device comprises one or more heat pipes, each of the one or more heat pipes comprising:
       a thermal conductive shell forming a sealed chamber; and
       a working fluid disposed in the sealed chamber, wherein a first portion of the working fluid is in liquid phase and a second portion of the working liquid is in gas phase.

19. The apparatus of claim 10, wherein each of the one or more heat pipes further comprises a wick structure lined inside the thermal conductive shell.

20. The method of claim 18, wherein cooling the plurality of heating elements comprises flowing a cooling fluid through cooling channels formed in the cooling elements.

* * * * *